US006956459B2

(12) United States Patent
Lau et al.

(10) Patent No.: US 6,956,459 B2
(45) Date of Patent: Oct. 18, 2005

(54) SENSING APPARATUS FOR BLOWN FUSE OF RECTIFYING WHEEL AND ASSOCIATED METHODS

(75) Inventors: James F. Lau, Orlando, FL (US); Anand Banthia, Arlington, TX (US)

(73) Assignee: Siemens Westinghouse Power Corporation, Orlando, FL (US)

( * ) Notice: Subject to any disclaimer, the term of this patent is extended or adjusted under 35 U.S.C. 154(b) by 169 days.

(21) Appl. No.: 10/691,935

(22) Filed: Oct. 23, 2003

(65) Prior Publication Data

US 2005/0088271 A1 Apr. 28, 2005

(51) Int. Cl.$^7$ .............................................. H01H 85/30
(52) U.S. Cl. ....................................... 337/267; 337/265
(58) Field of Search ................................ 337/206, 241, 337/242, 245, 265–267, 332, 79, 376; 439/490, 491; 324/507, 550, 117 H, 117 R; 340/638, 639, 648; 116/281, 283

(56) References Cited

U.S. PATENT DOCUMENTS

| | | | | |
|---|---|---|---|---|
| 3,030,531 A | | 4/1962 | Lessmann .................... 310/68 |
| 3,283,219 A | * | 11/1966 | Keady ......................... 257/725 |
| 3,866,196 A | | 2/1975 | Mann et al. ................ 340/250 |
| 4,136,312 A | * | 1/1979 | Salon et al. ................ 324/545 |
| 4,164,705 A | | 8/1979 | Whitney et al. ........... 324/158 |
| 4,349,813 A | | 9/1982 | Ishibashi et al. ........... 340/638 |
| 4,377,784 A | * | 3/1983 | Saito et al. ................. 324/772 |
| 4,506,218 A | * | 3/1985 | Brown et al. .............. 324/772 |
| 4,635,044 A | | 1/1987 | South ......................... 340/638 |
| 4,952,915 A | | 8/1990 | Jenkins et al. ............. 340/639 |
| 5,252,915 A | * | 10/1993 | Sedding et al. ............ 324/772 |
| 5,739,698 A | * | 4/1998 | Bowers et al. ............. 324/772 |
| 6,075,434 A | | 6/2000 | Rueckling ................... 337/160 |
| 6,256,183 B1 | | 7/2001 | Mosesian .................... 361/104 |
| 6,335,631 B2 | * | 1/2002 | Kliman et al. ............. 324/772 |
| 6,456,189 B1 | | 9/2002 | Mosesian et al. .......... 337/243 |
| 6,466,032 B2 | | 10/2002 | Klaar ......................... 324/536 |
| 6,839,660 B2 | * | 1/2005 | Eryurek et al. ............ 702/188 |

FOREIGN PATENT DOCUMENTS

JP          59132760 A   *   7/1984   .......... H02K/19/36

OTHER PUBLICATIONS

Ferraz Shawmut, British Standard URE/URS/URT, "Semi-conductor Protection Fuses", pp. D108–D110.
Ferraz Shawmut, EURO/IEC Fuses & Accessories gF, gl–gG, aM, "Cylindrical Fuse–Links", p. F2–F10.

* cited by examiner

Primary Examiner—Anatoly Vortman

(57) ABSTRACT

A blown fuse proximity sensing device 40 is for use with a rectifying wheel 37 of a type including rectifying diodes 38 and associated fuses 42. Each fuse 42 may include a housing 51, a fuse element 52 carried by the housing, and a pop-out indicator 54 movable between a normal position and a popped-out position. In the popped-out position, the indicator 54 extends outwardly from the housing responsive to failure of the fuse element. At least one stationary proximity sensor 44 is mounted adjacent the rectifying wheel 37 for sensing positions of the pop-out indicators 54 without contact therewith during rotation of the rectifying wheel to thereby sense at least one blown fuse. The sensing device 40 may also include a local display 61, and a controller 68 connected to the stationary proximity sensor 44 for generating an indication of a blown fuse on the local display. The controller 68 may also generate at least one remote output, such as to be monitored by other plant control equipment.

32 Claims, 4 Drawing Sheets

SENSING APPARATUS FOR BLOWN FUSE OF RECTIFYING WHEEL AND ASSOCIATED METHODS

FIELD OF THE INVENTION

The present invention relates to electrical power generation, and, more particularly, to detecting conditions of a rectifying wheel for a power generator and related methods.

BACKGROUND OF THE INVENTION

A typical power generator includes a shaft and a rotor carried by the shaft. Surrounding the generator rotor is a generator stator. A turbine, such as a gas combustion turbine, a water-driven turbine, or steam-driven turbine rotates the shaft. The generator rotor is supplied DC power typically from an exciter also driven by the shaft. As the generator rotor is turned within the generator stator, electrical power is produced and is delivered to the utility power grid.

The exciter typically includes an exciter rotor carried by a shaft connected to the generator shaft. An exciter stator surrounds exciter rotor. Regulated DC power is supplied to the exciter stator so that AC power is produced by the exciter rotor as the exciter rotor is rotated within the field produced by the exciter stator.

A rotating rectifier wheel, also called a diode wheel, is carried by the shaft of the exciter and converts the AC power from the exciter rotor into DC power that, in turn, is supplied to the generator rotor. A typical rectifying wheel includes a rotating base and a plurality of diodes carried by the base. A plurality of parallel connected diodes are typically provided for each phase of a multiphase exciter. A fuse is typically connected in series with each diode so that if the diode short-circuits, the fuse can isolate the defective diode. When sufficient redundancy is provided in the form of multiple diodes and fuses for each phase, one or more diodes or fuses may fail and the rectifier can still be operated. The exciter can be taken out of service and the defective components repaired at a more convenient time.

A typical approach to determining whether any of the fuses has blown is to visually inspect the rotating rectifying wheel while it is in service by using a stroboscope aimed into the exciter housing. A typical fuse may include a pop-out indicator that extends outwardly from the fuse housing when the fuse has failed. An example of such a fuse is disclosed in U.S. Pat. No. 6,256,183 B1 to Mosesian. Unfortunately, this approach requires careful visual inspection on a regular basis.

A similar approach to determine a fuse failure while the rectifying wheel is in service is disclosed in U.S. Pat. No. 3,030,551 to Lessman. This patent discloses a light connected to glow when the corresponding fuse has blown. Unfortunately, this approach also requires visual inspection using a stroboscope. Similarly, U.S. Pat. No. 3,866,196 to Mann et al. discloses a blown fuse indicator including a projectile that is normally held against movement and is released when the fuse blows. It can then be observed using a stroboscope as described above.

U.S. Pat. No. 4,164,705 to Whitney et al. discloses sensing current in the salient poles of the exciter stator. Variations in the sensed current can indicate a number of abnormal conditions, such as whether a fuse has blown.

U.S. Pat. No. 4,349,813 to Ishibashi et al. discloses a current transformer coupled between the fuse and diode. Voltage pulses induced by the secondary winding are received by a pulse extinction detection circuit. When the pulses are not detected, the pulse extinction detection circuit produces a DC signal. Along these lines, U.S. Pat. No. 4,635,044 to South discloses an apparatus for remote sensing of a failed fuse by sensing a current flow through each fuse. The operation of the current sensors is coordinated to the rotation of the wheel by an angle position oscillator that produces a constant stream of pulses at a preselected rate. Further, U.S. Pat. No. 6,466,032 B2 to Klaar discloses sensing electromagnetic pulses produced during the disconnection of the fuse by receiving the pulses at a station antenna. An encoder is also provided to determine the angular position of the rotating wheel.

U.S. Pat. No. 4,952,915 to Jenkins et al. discloses light emitting diode detectors carried by the rotating wheel being grouped to display concentric circles of light while operating. Stationary sensors are also provided to sense the LEDs, and the LEDs are connected so that if a fuse fails, the LED is lit. No synchronization is required between the detection circuit and the rotation of the rectifier wheel to thereby simplify construction and operation.

Despite continuing efforts to determine when a fuse of a rectifying wheel is blown, there still exists a need for a more reliable and effective system and method.

SUMMARY OF THE INVENTION

In view of the foregoing background, it is therefore an object of the present invention to provide a rectifying wheel and associated apparatus for more readily and effectively sensing whether any fuses are blown.

These and other objects, features and advantages in accordance with the present invention by a blown fuse proximity sensing apparatus for use with a rectifying wheel. More particularly, the rectifying wheel may comprise a plurality of rectifying diodes and a plurality of fuses associated therewith. Each fuse may include a housing, a fuse element carried by the housing, and a pop-out indicator movable between a normal position and a popped-out position. In the popped-out position, the indicator extends outwardly from the housing responsive to failure of the fuse element to thereby indicate a blown fuse. The sensing apparatus may include at least one stationary proximity sensor mounted adjacent the rectifying wheel for sensing positions of the pop-out indicators without contact therewith during rotation of the rectifying wheel to thereby sense a blown fuse. Accordingly, proper operation of the rectifying wheel may be readily and accurately monitored while the electrical apparatus, such as the brushless exciter, remains in service.

The sensing apparatus may also include a local display, and a controller connected to the stationary proximity sensor for generating an indication of a blown fuse on the local display. The controller may also generate at least one remote output, such as to be monitored by other plant control equipment.

The plurality of fuses may be connected in respective groups of fuses for each phase. The controller may advantageously determine multiple blown fuses for each given phase. In addition, the controller may generate an alarm indication based upon a predetermined number of blown fuses for each given phase. In other words, an alarm may be given when multiple fuse failures indicate that corrective maintenance is needed.

In some embodiments, the controller may determine multiple blown fuses for each given phase without angular position sensing of the rectifying wheel. This simplifies construction and operation of the sensing apparatus. In other embodiments, the angular position may be sensed.

The stationary proximity sensor may comprise a magnetic proximity sensor. In yet other embodiments, the proximity sensor may comprise one or more of an optical proximity sensor, an electric field proximity sensor, an ultrasonic proximity sensor, and an infrared proximity sensor A method aspect of the invention is directed to sensing at least one blown fuse of a rectifying wheel as described herein. The method may comprise mounting at least one stationary proximity sensor adjacent the rectifying wheel for sensing positions of the pop-out indicators without contact therewith during rotation of the rectifying wheel to thereby sense at least one blown fuse.

DETAILED DESCRIPTION OF THE PREFERRED EMBODIMENTS

The present invention will now be described more fully hereinafter with reference to the accompanying drawings in which preferred embodiments of the invention are shown. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numbers refer to like elements throughout and prime notation is used to indicate similar elements in alternate embodiments.

Figure 1:
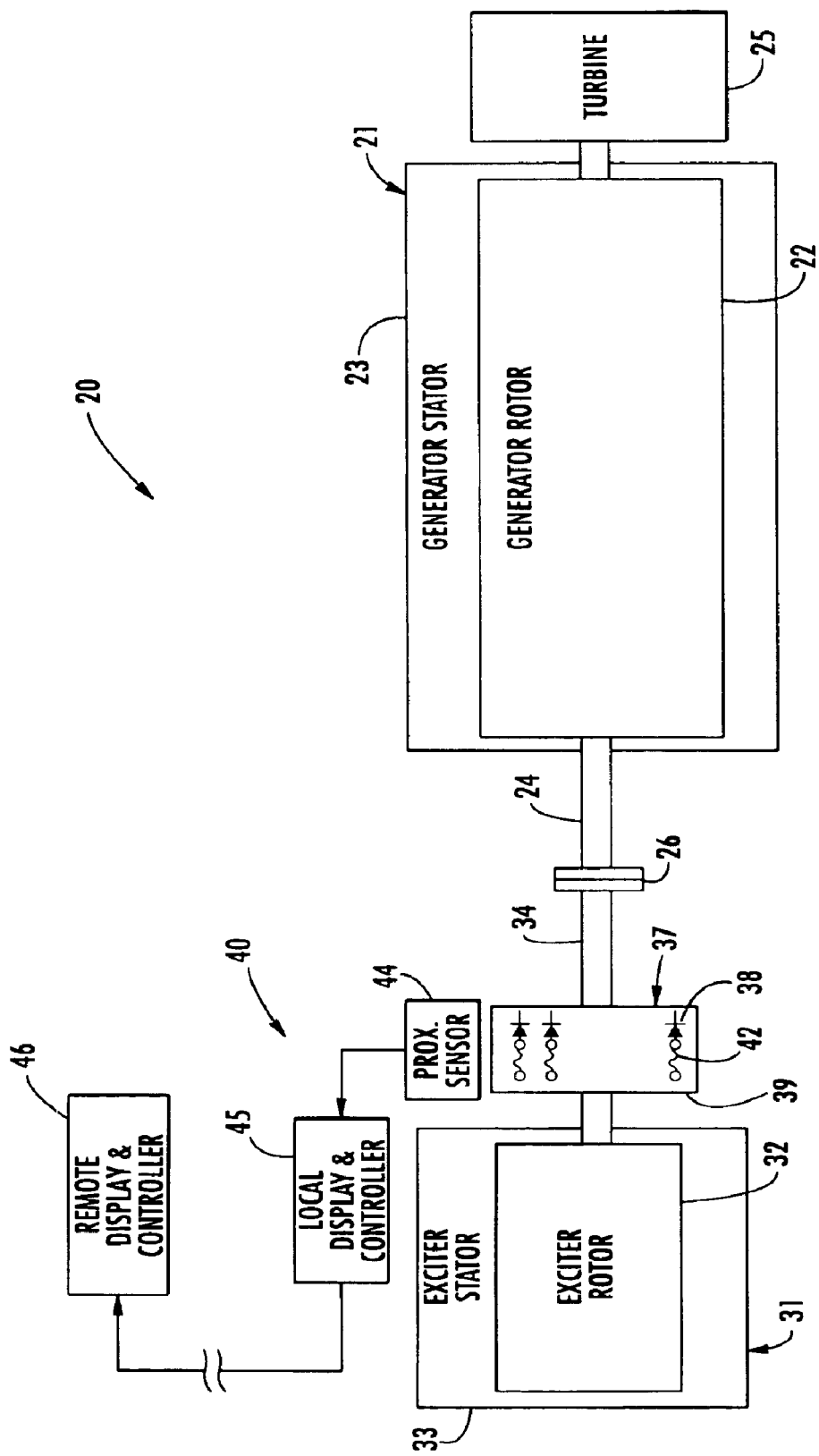
FIG. 1 is a schematic diagram of an exciter and generator including a blown fuse sensing apparatus in accordance with the present invention.

Referring initially to FIG. 1, the electrical apparatus 20 including the blown fuse sensing apparatus 40 in accordance with the invention is now described. The electrical apparatus 20 illustratively includes a generator 21 and an exciter 31 connected thereto. More particularly, the generator 21 includes a generator rotor 22 and generator stator 23 surrounding the rotor. The generator rotor 21 is driven by a turbine 25. The turbine 25 may be a steam turbine, gas turbine, or water turbine as will be appreciated by those skilled in the art.

The first shaft 24 is coupled via a coupling 26 to a second shaft 34. This second shaft 34 supports the exciter rotor 32. The exciter rotor 32 is surrounded by an exciter stator 33. A rectifying wheel 37 is also carried by the second shaft 34.

The rectifying wheel 37 carries a plurality of semiconductor diodes 38 for rectifying the AC power created by the exciter into DC power for energizing the generator rotor 22 as will be appreciated by those skilled in the art. The diodes 38, in turn, are protected by respective fuses 42 as will be described in greater detail below.

The electrical apparatus 20 also includes a blown fuse sensing apparatus 40 for sensing when at least one fuse 42 on the rectifying wheel 37 has blown. As will be understood by those of skill in the art, electrical surges and/or heat and vibration may cause a diode 38 and/or fuse 42 to fail. The fuses 42 protect the equipment should a diode 38 become short-circuited, for example. Occasionally, the fuses 42 themselves may fail irrespective of a failure of the associated diode 38. Most exciters 31 will include a group of diodes 38 and associated fuses 42 for each electrical phase. Accordingly, the exciter 31 can still operate even with some of the fuses 42 blown.

In accordance with the present invention, each fuse 42 includes a pop-out indicator for indicating that the fuse is blown as described in greater detail below. The sensing apparatus 40 illustratively includes a stationary proximity sensor 44 mounted adjacent the rectifying wheel 37 for sensing positions of the pop-out indicators without contact therewith during rotation of the rectifying wheel to thereby sense at least one blown fuse 42. Of course, more than one proximity sensor 44 may be used in other embodiments.

The sensing apparatus 40 also includes a local display/ controller 45 adjacent the exciter 31 for providing an operator with a local indication of the status of the fuses 42. This local display/controller 45 may also interface to remote plant control equipment 46 as will be appreciated by those of skill in the art, such as for display at an operator's control station, for example.

The proximity sensing provided by the blown fuse sensing apparatus 40 permits readily and accurately determining the status of the fuses 42 of the rectifying wheel 37 of the exciter 31 for the generator 21. Those of skill in the art will appreciate that the blown fuse sensing apparatus 40 can be used in other electrical system applications as well.

Figure 2:
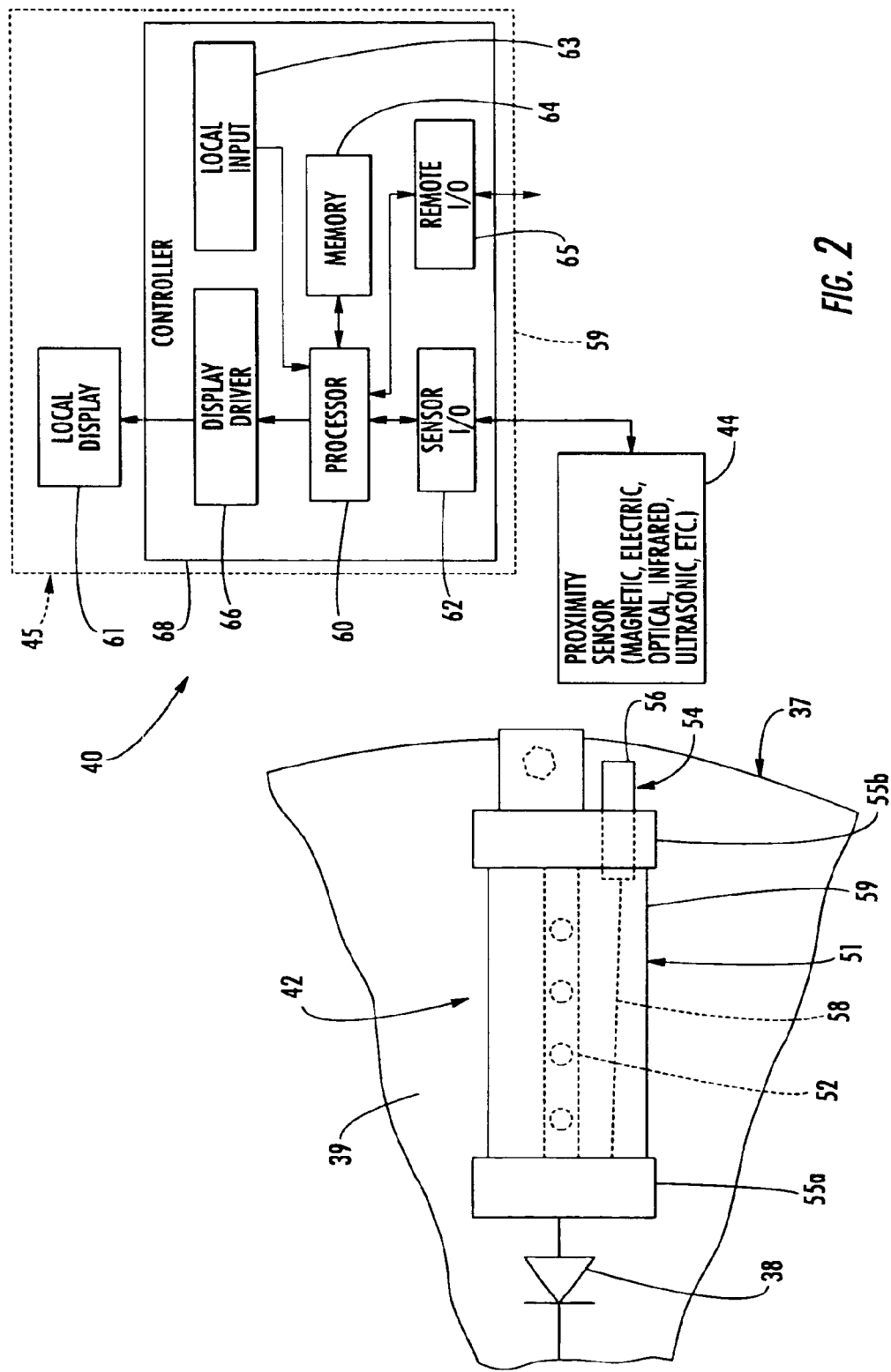
FIG. 2 is a more detailed schematic block diagram of the blown fuse sensing apparatus as shown in FIG. 1, and showing a portion of a fuse of the rectifier wheel being sensed.
Figure 3:
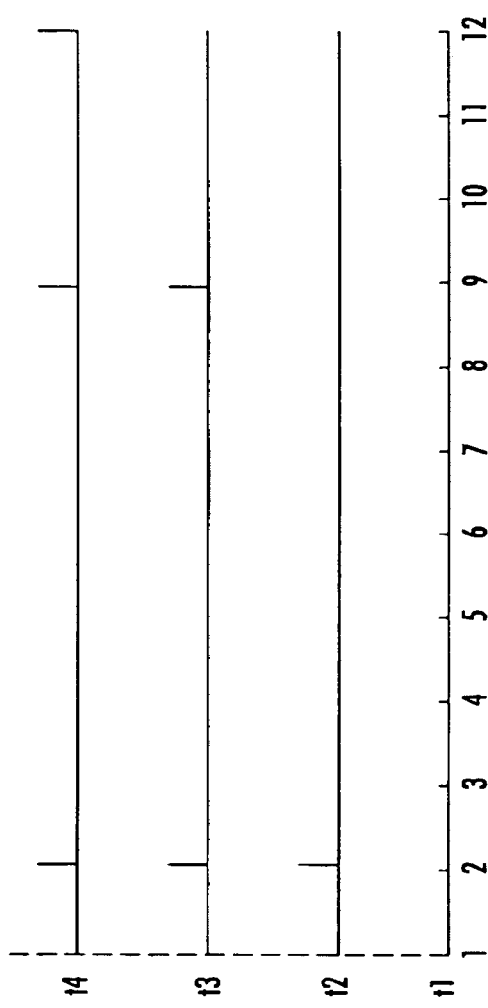
FIG. 3 is a schematic diagram of signals processed from the blown fuse sensing apparatus as shown in FIG. 2.

Turning now additionally to FIGS. 2 and 3, the blown fuse sensing apparatus 40 is now described in greater detail. As noted above, the rectifying wheel 37 includes a rotating base 39, a plurality of rectifying diodes 38 carried by the base, and a plurality of fuses 42 carried by the base and associated with respective diodes. Only a single diode 38 and single fuse 42 are shown in FIG. 2 for clarity of explanation. The fuse 42 illustratively includes a casing or housing 51, an internal fuse element 52 within the housing, and a pop-out indicator 54 movable between a normal position and a popped-out position. In the popped-out position the indicator 54 may extend outwardly from the housing about one-half an inch, for example. In the popped-out position, the indicator 54 extends outwardly from the housing 51 responsive to failure of the fuse element 52 to thereby indicate that the fuse has blown.

The housing 51 includes a tubular body 59 and a pair of spaced apart end electrodes or ferrules 55a, 55b connected thereto. An insulating material, such as sand, for example, surrounds the fuse element 52 and fills the interior of the housing 51 as will be appreciated by those skilled in the art.

The fuse 42 with the pop-out indicator 54 may be of the type as offered by Ferraz Shawmut Inc. that has a North American Headquarters in Newburyport, Mass. The pop-out indicator 54 may include a spring biased member 56 that is released by a meltable element 58 connected in parallel with the fuse element 52. U.S. Pat. No. 6,256,183 B1 to Mosesian discloses such a fuse and is incorporated herein by reference in its entirety.

The local display/controller 45 includes the local display 61 and a controller 68 connected thereto. Both may be contained within a common housing 59. The controller 68 is connected to the stationary proximity sensor 44 and illustratively includes a processor 60 and a display driver 66 connected thereto for generating an indication of a blown fuse 42 on the local display 61. The controller 68 also illustratively includes a memory 64 connected to the processor 60 although in some embodiments the memory may be embedded with the processor as will be appreciated by those skilled in the art.

The controller 68 also includes a local input device 63, such as a keyboard or series of switches, for example, for permitting selection of various operating parameters. The controller 68 also includes sensor input/output circuitry 62 for electrically interfacing the processor 60 to the proximity sensor 44. In addition, the controller 68 also illustratively includes a remote input/output circuit 65 for interfacing the processor 60 to downstream circuitry, such as the remote display and controller 46 (FIG. 1). This remote I/O circuitry 65 may provide dry relay contact outputs and/or a serial or data communications bus interface, for example.

The plurality of fuses 42 may be electrically connected in respective groups of fuses for each phase. The groups of fuses 42 may be physically arranged in a pattern about the rectifying wheel 37, such as ABC ABC . . . , for example. The controller 68 may advantageously determine multiple blown fuses for each given phase. The controller 68 may generate an alarm indication based upon a predetermined number of blown fuses for each given phase. In other words, an alarm may be given when multiple fuse failures indicate that corrective maintenance is needed.

The stationary proximity sensor 44 may comprise a magnetic proximity sensor. In yet other embodiments, the proximity sensor may comprise one or more of an optical proximity sensor, an electric field proximity sensor, an ultrasonic proximity sensor, and an infrared proximity sensor. Proximity sensing of the pop-out indicator 54 using such sensors provides a very reliable and simple approach to determine whether a fuse 42 is blown.

As understood with reference to FIG. 3, at a first time t1, none of the fuses 42 are blown in accordance with a hypothetical example of operation of the sensing apparatus 40. At time t2, a fuse is detected as a blown fuse as indicated by the spike at position 2. Later, at time t3, another fuse is detected as being blown and this fuse is at position 9. Thereafter at time t4, yet another fuse is indicated at being blown at position 12. Since two fuses, at positions 9 and 12, are now indicated as being blown, and since these are known to be in the same phase because of a phase pattern of ABC ABC . . . , an alarm may be generated so that the rectifying wheel 37 can be taken out of service and the blown fuses replaced. Of course, the alarm threshold could be set for other numbers of fuses in each phase, and/or a total number of fuses irrespective of the phases. Of interest, it is not necessary to sense the absolute angular position of the rectifying wheel 37 to know that multiple fuses in the same phase are blown as will be appreciated by those skilled in the art. This simplifies construction and operation of the sensing apparatus 40.

Figure 5:
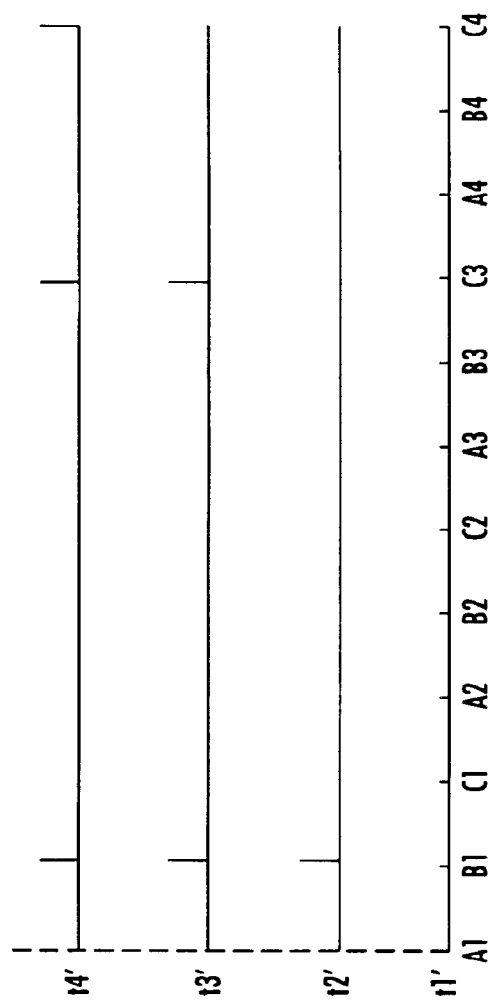
FIG. 5 is a schematic diagram of signals processed from the blown fuse sensing apparatus as shown in FIG. 4.
Figure 4:
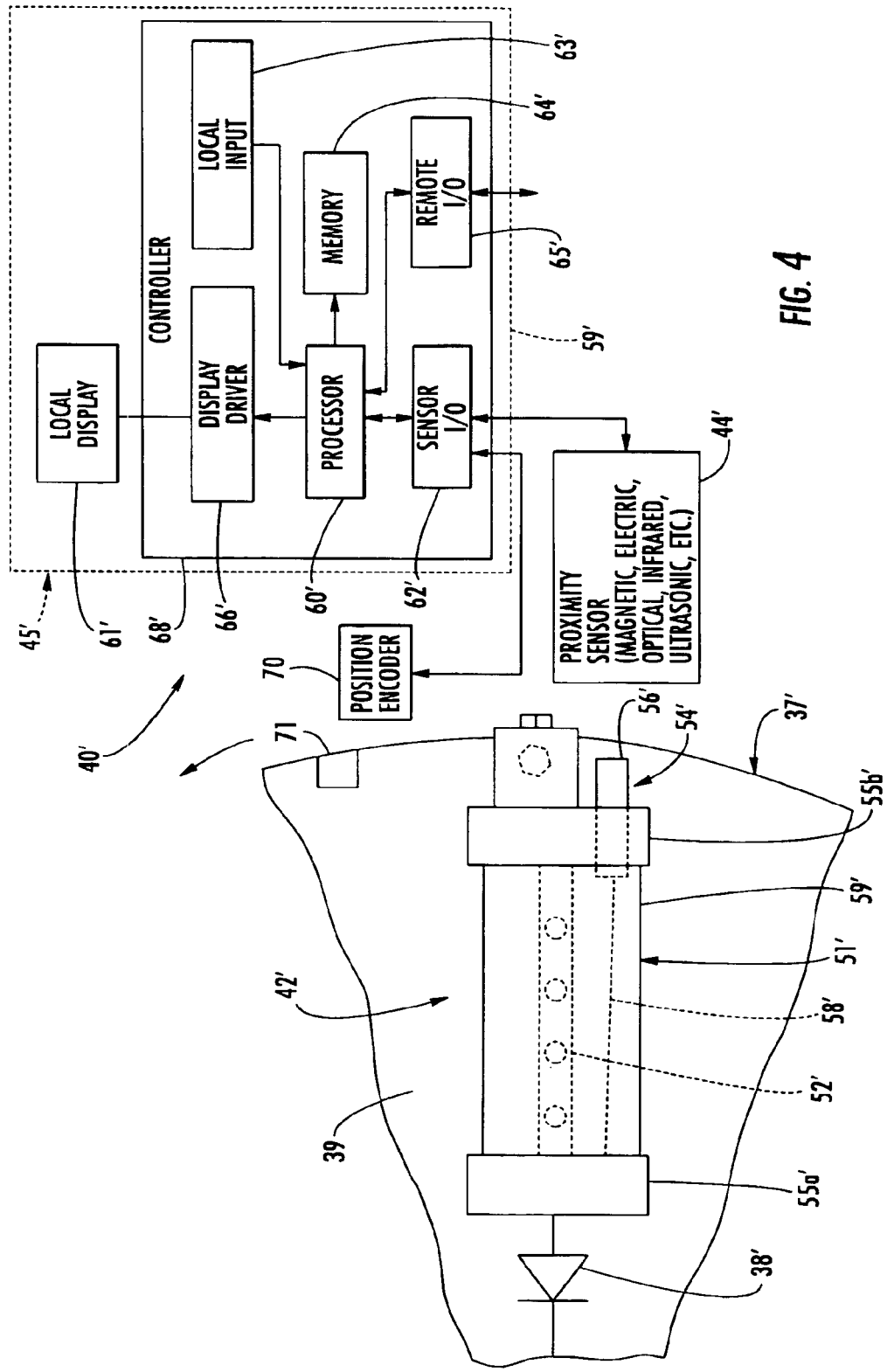
FIG. 4 is an alternate embodiment of the blown fuse sensing apparatus as shown in FIG. 2, and showing a portion of a fuse of the rectifier wheel being sensed.

Turning now additionally to FIGS. 4 and 5, another embodiment of the sensing apparatus 40' is now described. In this embodiment, the sensing apparatus 40' also includes a marker 71 on the rectifying wheel 37' and an angular position encoder or sensor 70 cooperating with the marker to determine an absolute angular position of the rectifying wheel 37'. The output of the position encoder 70 is coupled to the controller 68' via the sensor I/O circuitry 62'. Accordingly, the controller 68' can determine which fuse in which phase is blown. Those other elements of the apparatus 40' are indicated with prime notation and are similar to those described above with reference to the apparatus 40 described above with reference to FIG. 2. These other elements need no further discussion herein.

As shown in FIG. 5, the controller 68' can determine which fuse in which phase is blown. At time t1, no fuse in any phase is blown. At time t2, the number one fuse in the B phase is blown. At time t3, another fuse, the third fuse in the C phase is blown. At time t4, the fourth fuse in the C phase is determined as blown, and an appropriate alarm may be generated to indicate a need for corrective maintenance.

A method aspect of the invention is directed to sensing at least one blown fuse 42 of a rectifying wheel 37 as described herein. The method may comprise mounting at least one stationary proximity sensor 44 adjacent the rectifying wheel for sensing positions of the pop-out indicators 54 without contact therewith during rotation of the rectifying wheel to thereby sense at least one blown fuse. Many modifications and other embodiments of the invention will come to the mind of one skilled in the art having the benefit of the teachings presented in the foregoing descriptions and the associated drawings. Accordingly, it is understood that the invention is not to be limited to the embodiments disclosed, and that other modifications and embodiments are intended to be included within the spirit and scope of the appended claims.

That which is claimed is:

1. An electrical apparatus comprising:
   a rectifying wheel comprising a plurality of rectifying diodes and a plurality of fuses associated therewith, each fuse comprising
   a housing,
   a fuse element carried by said housing, and
   a pop-out indicator movable between a normal position and a popped-out position extending outwardly from said housing responsive to failure of said fuse element to thereby indicate a blown fuse; and
   at least one stationary proximity sensor mounted adjacent said rectifying wheel for sensing positions of said pop-out indicators without contact therewith during rotation of said rectifying wheel to thereby sense at least one blown fuse.

2. The electrical apparatus according to claim 1 further comprising:
   a local display; and
   a controller connected to said at least one stationary proximity sensor for generating an indication of at least one blown fuse on said local display.

3. The electrical apparatus according to claim 2 wherein said controller generates at least one remote output.

4. The electrical apparatus according to claim 2 wherein said plurality of fuses are connected in respective groups of fuses for each phase; and wherein said controller determines multiple blown fuses for each given phase.

5. The electrical apparatus according to claim 4 wherein said controller generates an alarm indication based upon a predetermined number of blown fuses for each given phase.

6. The electrical apparatus according to claim 4 wherein said controller determines multiple blown fuses for each given phase without angular position sensing of said rectifying wheel.

7. The electrical apparatus according to claim 4 wherein said controller determines multiple blown fuses for each given phase with angular position sensing of said rectifier wheel.

8. The electrical apparatus according to claim 1 wherein said at least one stationary proximity sensor comprises at least one magnetic proximity sensor.

9. The electrical apparatus according to claim 1 wherein said at least one stationary proximity sensor comprises at least one optical proximity sensor.

10. The electrical apparatus according to claim 1 wherein said at least one stationary proximity sensor comprises at least one electric field proximity sensor.

11. The electrical apparatus according to claim 1 wherein said at least one stationary proximity sensor comprises at least one ultrasonic proximity sensor.

12. The electrical apparatus according to claim 1 wherein said at least one stationary proximity sensor comprises at least one infrared proximity sensor.

13. The electrical apparatus according to claim 1 further comprising:
- a shaft connected to said rectifying wheel;
- an exciter rotor carried by said shaft; and
- a exciter stator surrounding said exciter rotor.

14. A blown fuse sensing apparatus for use with a rectifying wheel comprising a plurality of rectifying diodes and a plurality of fuses associated therewith, with each fuse comprising a housing, a fuse element carried by the housing, and a pop-out indicator movable between a normal position and a popped-out position extending outwardly from the housing responsive to failure of the fuse element to thereby indicate a blown fuse, the blown fuse sensing apparatus comprising:
- at least one stationary proximity sensor mounted adjacent the rectifying wheel for sensing positions of the pop-out indicators without contact therewith during rotation of the rectifying wheel to thereby sense at least one blown fuse;
- a local display; and
- a controller connected to said at least one stationary proximity sensor for generating an indication of at least one blown fuse on said local display.

15. The blown fuse sensing apparatus according to claim 14 wherein said controller generates at least one remote output.

16. The blown fuse sensing apparatus according to claim 14 wherein the plurality of fuses are connected in respective groups of fuses for each phase; and wherein said controller determines multiple blown fuses for each given phase.

17. The blown fuse sensing apparatus according to claim 16 wherein said controller generates an alarm indication based upon a predetermined number of blown fuses for each given phase.

18. The blown fuse sensing apparatus according to claim 16 wherein said controller determines multiple blown fuses for each given phase without angular position sensing of the rectifying wheel.

19. The electrical apparatus according to claim 16 wherein said controller determines multiple blown fuses for each given phase with angular position sensing of said rectifier wheel.

20. The blown fuse sensing apparatus according to claim 14 wherein said at least one stationary proximity sensor comprises at least one magnetic proximity sensor.

21. The blown fuse sensing apparatus according to claim 14 wherein said at least one stationary proximity sensor comprises at least one optical proximity sensor.

22. The blown fuse sensing apparatus according to claim 14 wherein said at least one stationary proximity sensor comprises at least one electric field proximity sensor.

23. The blown fuse sensing apparatus according to claim 14 wherein said at least one stationary proximity sensor comprises at least one ultrasonic proximity sensor.

24. The blown fuse sensing apparatus according to claim 14 wherein said at least one stationary proximity sensor comprises at least one infrared proximity sensor.

25. A method of sensing at least one blown fuse of a rectifying wheel comprising a plurality of rectifying diodes and a plurality of fuses associated therewith, with each fuse comprising a housing, a fuse element carried by the housing, and a pop-out indicator movable between a normal position and a popped-out position extending outwardly from the housing responsive to failure of the fuse element to thereby indicate a blown fuse, the method comprising:
- mounting at least one stationary proximity sensor adjacent the rectifying wheel for proximity sensing positions of the pop-out indicators without contact therewith during rotation of the rectifying wheel to thereby sense at least one blown fuse.

26. The method according to claim 25 further comprising providing a local display and connecting a controller to the at least one stationary proximity sensor for generating an indication of at least one blown fuse on the local display.

27. The method according to claim 26 further comprising using the controller to generate at least one remote output.

28. The method according to claim 26 wherein the plurality of fuses are connected in respective groups of fuses for each phase; and further comprising using the controller to determine multiple blown fuses for each given phase.

29. The method according to claim 28 further comprising using the controller to generate an alarm indication based upon a predetermined number of blown fuses for each given phase.

30. The method according to claim 28 further comprising using the controller to determine multiple blown fuses for each given phase without angular position sensing of the rectifying wheel.

31. The method according to claim 28 further comprising using the controller to determine multiple blown fuses for each given phase with angular position sensing of the rectifying wheel.

32. The method according to claim 25 wherein the at least one stationary proximity sensor comprises at least one of a magnetic proximity sensor, an optical proximity sensor, an electric field proximity sensor, an ultrasonic proximity sensor, and an infrared proximity sensor.

* * * * *